(12) United States Patent
Su et al.

(10) Patent No.: US 12,726,157 B2
(45) Date of Patent: Sep. 1, 2026

(54) POWER CONTROL APPARATUS FOR IMPROVING HARMONIC WAVE, AND POWER AMPLIFIER AND DEVICE

(71) Applicant: SMARTER MICROELECTRONICS (GUANG ZHOU) CO., LTD., Guangzhou (CN)

(72) Inventors: Qiang Su, Guangzhou (CN); Chifeng Liu, Guangzhou (CN); Jiangtao Yi, Guangzhou (CN)

(73) Assignee: SMARTER MICROELECTRONICS (GUANG ZHOU) CO., LTD., Guangzhou (CN)

( * ) Notice: Subject to any disclaimer, the term of this patent is extended or adjusted under 35 U.S.C. 154(b) by 805 days.

(21) Appl. No.: 18/063,652

(22) Filed: Dec. 8, 2022

(65) Prior Publication Data

US 2023/0106332 A1 Apr. 6, 2023

Related U.S. Application Data

(63) Continuation of application No. PCT/CN2021/103085, filed on Jun. 29, 2021.

(30) Foreign Application Priority Data

Oct. 13, 2020 (CN) ......................... 202011092214.8

(51) Int. Cl.
*H03F 3/45* (2006.01)
*H03F 1/26* (2006.01)
*H03F 3/21* (2006.01)

(52) U.S. Cl.
CPC ................. *H03F 1/26* (2013.01); *H03F 3/21* (2013.01); *H03F 3/45* (2013.01); *H03F 2200/451* (2013.01)

(58) Field of Classification Search
CPC .................................. H03F 3/45; H03F 3/191
USPC ........................................ 330/257, 260, 302
See application file for complete search history.

*Primary Examiner* — Henry Choe
(74) *Attorney, Agent, or Firm* — Syncoda LLC; Feng Ma

(57) ABSTRACT

A power control apparatus comprises a voltage conversion circuit and a power control circuit, wherein the voltage conversion circuit is used for converting a power control voltage and outputting a target control voltage; and the power control circuit is connected to the voltage conversion circuit and is used for performing power control on a received input signal according to the target control voltage, so as to obtain a target output signal. In this way, by means of the cooperation of a voltage conversion circuit and a power control circuit, a target control voltage performs power control on an input signal, such that the number of harmonic waves generated by a power amplifier during power back-off can be reduced, thereby improving the harmonic performance of the power amplifier.

9 Claims, 18 Drawing Sheets

POWER CONTROL APPARATUS FOR IMPROVING HARMONIC WAVE, AND POWER AMPLIFIER AND DEVICE

CROSS REFERENCE TO RELATED APPLICATIONS

This is a continuation application of International Patent Application No. PCT/CN2021/103085 filed on Jun. 29, 2021, which claims priority to Chinese Patent Application No. 202011092214.8 filed on Oct. 13, 2020. The disclosures of the above-referenced applications are hereby incorporated by reference in their entirety.

BACKGROUND

At present, Radio Frequency (RF) power amplifier (PA) is widely applied in the field of cellular communication, and RF PA supporting Global System for Mobile Communications (GSM) in the 2nd Generation (2G) global mobile communication technology will be irreplaceable for a long time. With the continuous popularization of the 5th Generation (5G) mobile communication technology, it is expected that GSM frequency bands will be gradually released, and spectrums will be divided finer and finer.

Under the context of coexistence of the 2G/the 3rd Generation (3G)/the 4th Generation (4G)/5G global mobile communication technology systems, in order to ensure user experience, requirements on indices of GSM PA by the communication system have been stricter. However, in the current related technologies, the GSM PA has poor harmonic performance, resulting in poor call quality in a complex spectrum environment.

SUMMARY

The disclosure relates to the technical field of communication, and in particular to a power control apparatus for improving harmonic waves, a power amplifier, and a device.

Embodiments of the disclosure provide a power control apparatus for improving harmonic waves, a power amplifier, and a device. A number of harmonic waves generated by a power amplifier during power back-off may be reduced through cooperation of a voltage conversion circuit and a power control circuit, thereby improving the harmonic performance of the power amplifier.

Technical solutions of the embodiments of the disclosure are implemented as follows.

In a first aspect, an embodiment of the disclosure provides a power control apparatus for improving harmonic waves, including a voltage conversion circuit and a power control circuit.

The voltage conversion circuit is configured to convert a power control voltage, to output a target control voltage.

The power control circuit is connected to the voltage conversion circuit, and is configured to perform power control on a received input signal according to the target control voltage, to obtain a target output signal.

In some embodiments, the voltage conversion circuit may include a first conversion sub-circuit, a first current sub-circuit, a second current sub-circuit and a second conversion sub-circuit.

The first conversion sub-circuit is configured to convert the power control voltage into a power control current.

The first current sub-circuit is connected to the first conversion sub-circuit, and is configured to generate a first current according to the power control current.

The second current sub-circuit is connected to the first conversion sub-circuit, and is configured to generate a second current according to the power control current.

The second conversion sub-circuit is connected to the first current sub-circuit and the second current sub-circuit respectively, and is configured to superimpose the first current and the second current and convert a superimposed current into the target control voltage.

In some embodiments, the power control circuit may include a first control sub-circuit, a first amplification sub-circuit, a second control sub-circuit and a second amplification sub-circuit.

The first control sub-circuit is configured to control a power supply voltage of the first amplification sub-circuit according to the target control voltage, to obtain a target power supply voltage.

The first amplification sub-circuit is connected to the first control sub-circuit, and is configured to perform first-level power amplification on the received input signal according to the target power supply voltage, to obtain an initially amplified signal.

The second control sub-circuit is configured to control a bias current of the second amplification sub-circuit according to the power control voltage, to obtain a target bias current.

The second amplification sub-circuit is connected to the first amplification sub-circuit and the second control sub-circuit respectively, and is configured to perform second-level power amplification on the initially amplified signal according to the target bias current, to obtain the target output signal.

In some embodiments, the power control circuit may further include an inter-stage matching circuit.

The inter-stage matching circuit is connected to the first amplification sub-circuit and the second amplification sub-circuit respectively, and is configured to perform impedance matching between the first amplification sub-circuit and the second amplification sub-circuit.

In some embodiments, the first conversion sub-circuit may include an operational amplifier, a first field effect transistor (FET), a first resistor and a capacitor.

An inverting input end of the operational amplifier is connected to the power control voltage, an output end of the operational amplifier is connected to a gate of the first FET and one end of the capacitor respectively, the other end of the capacitor is connected to a non-inverting input end of the operational amplifier, a drain of the first FET and the first resistor respectively, and the drain of the first FET is grounded through the first resistor.

In some embodiments, the second current sub-circuit may include a second FET, a first FET group, a second FET group and an adjustable current source.

A gate of the second FET is connected to the output end of the operational amplifier, a drain of the second FET is connected to an input end of the first FET group, and an output end of the first FET group is connected to an input end of the second FET group and the adjustable current source respectively.

In some embodiments, the first current sub-circuit may include a third adjustable FET, and the second conversion sub-circuit may include a second resistor.

A gate of the third adjustable FET is connected to the output end of the operational amplifier, and a drain of the third adjustable FET is connected to an output end of the second FET group and is grounded through the second resistor.

In some embodiments, the first FET group may include a fourth FET and a fifth FET connected by a common gate structure.

The second FET group may include a sixth FET and a seventh adjustable FET connected by a common gate structure.

In a second aspect, an embodiment of the disclosure provides a power amplifier including at least the power control apparatus as described in the first aspect.

In a third aspect, an embodiment of the disclosure provides an electronic device including at least the power amplifier as described in the second aspect.

Embodiments of the disclosure provide a power control apparatus for improving harmonic waves, a power amplifier, and a device. The power control apparatus includes a voltage conversion circuit and a power control circuit. The voltage conversion circuit is configured to convert a power control voltage, to output a target control voltage. The power control circuit is connected to the voltage conversion circuit, and is configured to perform power control on a received input signal according to the target control voltage, to obtain a target output signal. In this way, a direct current (DC) voltage of a pre-stage power amplifier may be reduced when a bias current of a final-stage power amplifier is small, through cooperation of the voltage conversion circuit and the power control circuit, thereby reducing magnitudes of harmonic waves generated by the power amplifier during power back-off, which may not only improve the harmonic performance of the power amplifier, but also improve call quality of a user in a more complex spectrum environment.

DETAILED DESCRIPTION

The technical solutions in the embodiments of the disclosure will be described clearly and completely below with reference to the accompanying drawings in the embodiments of the disclosure.

At present, RF PA is widely applied in the field of cellular communication, and RF PA supporting GSM in the 2G global mobile communication technology will be irreplaceable for a long time. With the continuous popularization of the 5G mobile communication technology, it is expected that a part of GSM frequency bands will be gradually released, and spectrums will be divided finer and finer. Furthermore, the 2G/3G/4G global mobile communication technologies are often in a coexistence environment. In order to ensure user experience in the context of increasingly scattered spectrums and coexistence of 2G/3G/4G/5G, requirements on indices of GSM PA by the system will increase, rather than decreasing. For example, in order to ensure call quality in a more complex spectrum environment, the harmonic performance of GSM PA is required to be better.

Figure 1:
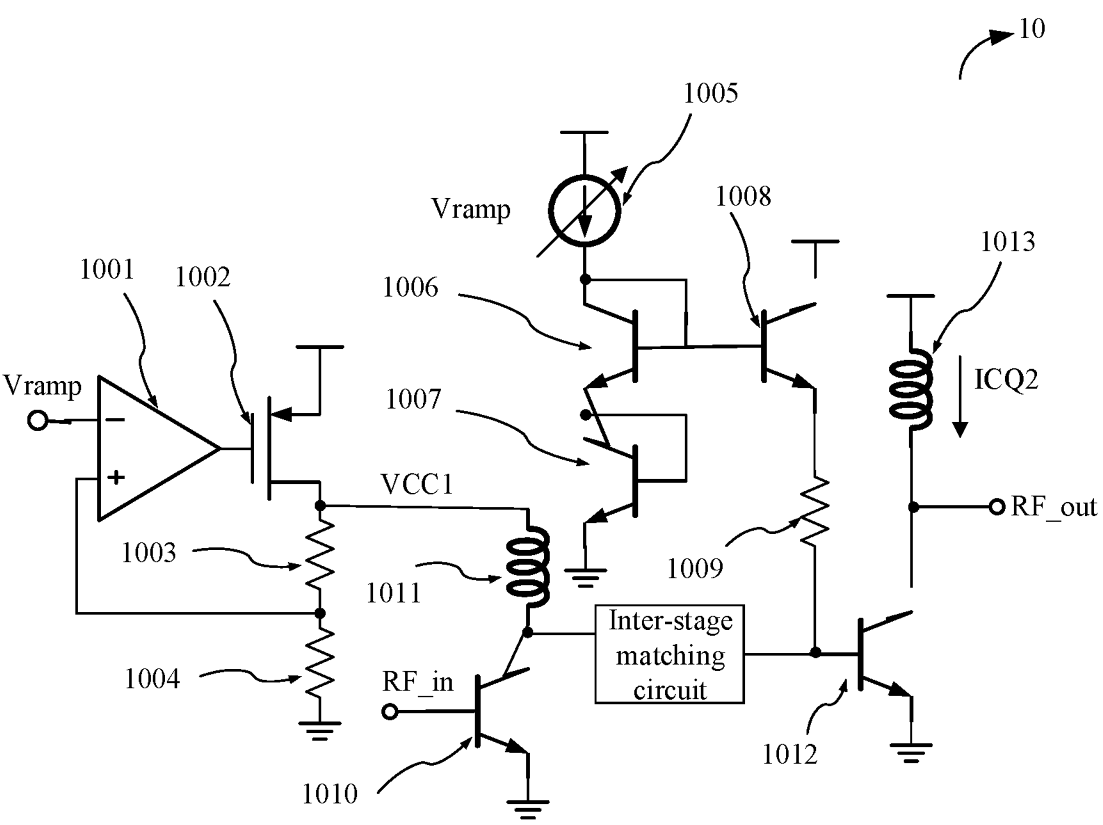
FIG. 1 is a schematic structural diagram of a circuit of a power control apparatus provided in some implementations.

Referring to FIG. 1, it shows a schematic structural diagram of a circuit of a power control apparatus 10 provided in some implementations. As shown in FIG. 1, the power control apparatus 10 is applied in a scenario of two-stage power amplifier including a pre-stage power amplifier and a final-stage power amplifier. The pre-stage power amplifier may include an operational amplifier 1001, a first FET 1002, a first resistor 1003, a second resistor 1004, a fifth transistor 1010 and a first inductor 1011; and the final-stage power amplifier may include a controlled current source 1005, a second transistor 1006, a third transistor 1007, a fourth transistor 1008, a third resistor 1009, a sixth transistor 1012 and a second inductor 1013.

Specifically, the fifth transistor 1010 and the first inductor 1011 constitute an output stage of the pre-stage power amplifier, the sixth transistor 1012 and the second inductor 1013 constitute an output stage of the final-stage power amplifier, and an output end of the pre-stage power amplifier and an input end of the final-stage power amplifier are connected through an Inter-Stage Match circuit (or referred to as an inter-stage matching network).

Figure 2A:
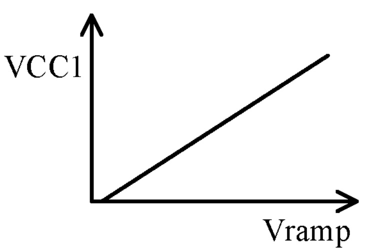
FIG. 2A is a schematic diagram of change between VCC1 and Vramp provided in some implementations.

In FIG. 1, VCC1 is a power supply voltage of the pre-stage power amplifier, ICQ2 is a bias current of the final-stage power amplifier, and Vramp is a power control voltage (equivalent to a power control signal). The operational amplifier 1001, the first FET 1002, the first resistor 1003 and the second resistor 1004 realize that VCC1 changes with Vramp and is configured to supply power to the pre-stage power amplifier. Referring to FIG. 2A, it shows a schematic diagram of change between VCC1 and Vramp provided in some implementations, here X axis (i.e., a horizontal axis) represents Vramp, and Y axis (i.e., a vertical axis) represents VCC1. As shown in FIG. 2A, VCC1 presents a linear increasing trend with the increase of Vramp.

Figure 2B:
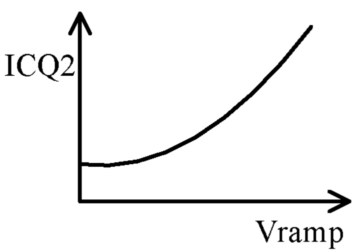
FIG. 2B is a schematic diagram of change between ICQ2 and Vramp provided in some implementations.

In FIG. 1, the controlled current source 1005, the second transistor 1006, the third transistor 1007, the fourth transistor 1008 and the third resistor 1009 constitute a bias circuit of the final-stage power amplifier, which is configured to provide the bias current ICQ2 to the final-stage power amplifier. An output current I1 of the controlled current source 1005 is controlled by Vramp, and the controlled current source 1005 is also responsible for providing a bias to the final-stage power amplifier. Referring to FIG. 2B, it shows a schematic diagram of change between ICQ2 and Vramp provided in some implementations, ICQ2. As shown in FIG. 2B, ICQ2 presents a rapid increasing trend with the increase of Vramp.

Furthermore, ICQ2 is controlled by a circuit constituted by the controlled current source 1005, the second transistor 1006, the third transistor 1007, the fourth transistor 1008 and the third resistor 1009. This bias is referred to as an emitter/source follower structure, having a simple expression as follows:

$$Vbe2+Vbe3=Vbe4+Ie4*R3+Vbe6 \quad (1)$$

Here Vbe2 represents a voltage of the second transistor 1006, Vbe3 represents a voltage of the third transistor 1007, Vbe4 represents a voltage of the fourth transistor 1008, Vbe6 represents a voltage of the sixth transistor 1012, Ie4 represents a current of the controlled current source 1005, and R3 represents a resistance of the third resistor 1009.

In some implementations, a process of controlling output power is as follows. Vramp controls a DC voltage (VCC1) at the output end of the pre-stage, thereby controlling output power of the pre-stage (i.e., input power of the final-stage); furthermore, Vramp also controls the bias current (ICQ2) of the final-stage, the bias current cooperates with the input power to control output power of the final-stage. That is, in general, an input signal RF_in is large enough to make the power amplifier operate in a saturated state (i.e., the output power does not change with RF_in), and Vramp controls VCC1 (i.e., a voltage of power supply) at the output end of the pre-stage, thereby controlling the output power of the pre-stage (i.e., the input power of the final-stage). That is, amplitude of an output voltage is related to VCC1, and it is assumed that impedance is known, then the output power of the pre-stage may be determined. Furthermore, the bias current ICQ2 of the final-stage (also referred to as a quiescent current) affects a bias state of the final-stage, and accordingly affects a gain and maximum output power of the final-stage.

Figure 3A:
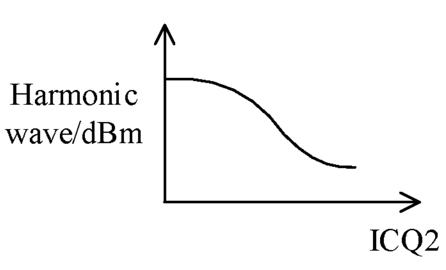
FIG. 3A is a schematic diagram of change between a harmonic wave and ICQ2 provided in some implementations.
Figure 3B:
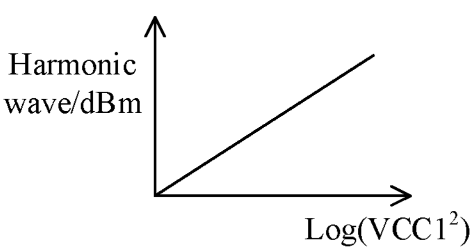
FIG. 3B is a schematic diagram of change between a harmonic wave and Log(VCC12) provided in some implementations.
Figure 3C:
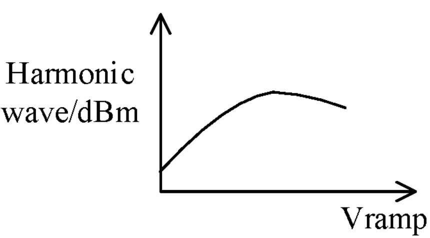
FIG. 3C is a schematic diagram of change between a harmonic wave and Vramp provided in some implementations.

According to the power control apparatus 10 shown in FIG. 1, referring to FIG. 3A, it shows a schematic diagram of change between a harmonic wave and ICQ2 provided in some implementations, here X axis (i.e., a horizontal axis) represents ICQ2, and Y axis (i.e., a vertical axis) represents a magnitude of a harmonic wave. Referring to FIG. 3B, it shows a schematic diagram of change between a harmonic wave and Log(VCC12) provided in some implementations, here X axis (i.e., a horizontal axis) represents Log(VCC12), and Y axis (i.e., a vertical axis) represents a magnitude of a harmonic wave. Referring to FIG. 3C, it shows a schematic diagram of change between a harmonic wave and Vramp provided in some implementations, here X axis (i.e., a horizontal axis) represents Vramp, and Y axis (i.e., a vertical axis) represents a magnitude of a harmonic wave.

As shown in the aforementioned FIG. 2A and FIG. 2B, ICQ2 and VCC1 increase in-phase with Vramp. As shown in the aforementioned FIG. 3A and FIG. 3B, for an output harmonic wave of the final-stage, the magnitude of the harmonic wave changes in opposite phase with ICQ2, and the magnitude of the harmonic wave changes in normal phase with the input power (i.e., VCC1). Therefore, as shown in FIG. 3C, in a process of Vramp increasing, there will be a maximum peak point of the harmonic wave. Conditions of occurrence of this point are that ICQ2 of the final-stage is small, but the input power is already large. A combined action of these two conditions leads to generation of a large harmonic wave. That is, an occasion for the worst harmonic performance of the power amplifier does not occur at the time when the maximum power is output, and the harmonic performance may be even worse at a time interval after the power back-off. Therefore, even though the harmonic waves of the power amplifier may meet requirements when the maximum power is output, it does not indicate that the harmonic performance of the power amplifier meets requirements.

On this basis, an embodiment of the disclosure provides a power control apparatus for improving harmonic waves, including a voltage conversion circuit and a power control circuit. The voltage conversion circuit is configured to convert a power control voltage, to output a target control voltage. The power control circuit is connected to the voltage conversion circuit, and is configured to perform power control on a received input signal according to the target control voltage, to obtain a target output signal. In this way, a DC voltage of a pre-stage power amplifier may be reduced when a bias current of a final-stage power amplifier is small, through cooperation of the voltage conversion circuit and the power control circuit, thereby reducing magnitudes of harmonic waves generated by the power amplifier during power back-off, which finally improves the harmonic performance of the power amplifier, and improves call quality of a user in a more complex spectrum environment.

The disclosure will be described in further detail below with reference to the accompanying drawings and specific embodiments.

Figure 4:
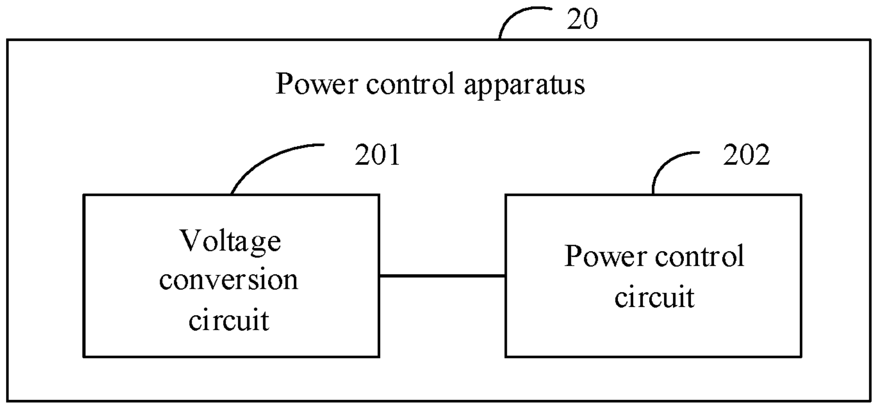
FIG. 4 is a schematic structural diagram of a power control apparatus provided by an embodiment of the disclosure.

In an embodiment of the disclosure, referring to FIG. 4, it shows a schematic structural diagram of a power control apparatus 200 provided by an embodiment of the disclosure. As shown in FIG. 4, the power control apparatus 20 may include a voltage conversion circuit 201 and a power control circuit 202.

The voltage conversion circuit 201 is configured to convert a power control voltage, to output a target control voltage.

The power control circuit 202 is connected to the voltage conversion circuit 201, and is configured to perform power control on a received input signal according to the target control voltage, to obtain a target output signal.

It should be noted that the power control apparatus 20 may be understood as a part of the power amplifier, which may amplify power of the input signal to obtain the output signal, and is extremely important element in the communication field. However, in different usage scenarios, the power amplifier has different amplification requirements for the input signal, therefore the power control apparatus 20 needs to adjust amplification power of the input signal according to the power control voltage (i.e. Vramp) to achieve the best amplification effect.

In the embodiment of the disclosure, the power control apparatus 20 includes the voltage conversion circuit 201 and the power control circuit 202. The power control voltage (Vramp) is converted into the target control voltage by the voltage conversion circuit 201, then an input signal (RF_in)

is amplified by the power control circuit 202 according to the target control voltage, and finally, an amplified output signal (RF_out) is output.

It should also be noted that circuit parameters of the power conversion circuit 201 are adjustable. That is, the power conversion circuit 201 includes some adjustable circuit elements (such as an adjustable FET, an adjustable resistor, an adjustable power supply, or the like), and the circuit parameters of the power conversion circuit 201 may be adjusted through control of the adjustable circuit elements by a digital configuration circuit, so that a conversion relationship between the power control voltage and the target control voltage may be adjusted.

An advantage of doing this is that the conversion relationship between the power control voltage (Vramp) and the target control voltage may be adjusted by the voltage conversion circuit 201, which may improve output harmonic waves generated when the input signal is subjected to power amplification. Specifically, when the bias current of the final-stage power amplifier is small, the input power of the final-stage power amplifier may be reduced by the voltage conversion circuit 201 adjusting the target control voltage, thereby reducing the output harmonic waves of the final-stage power amplifier. In this way, the harmonic performance of the power amplifier may be improved through the voltage conversion circuit 201, thereby improving usage effect of the power amplifier.

In a specific implementation, the voltage conversion circuit 201 may include a first current sub-circuit 2012 and a second current sub-circuit 2013 configured to convert the power control voltage to output the target control voltage. The target control voltage is obtained based on a first current output by the first current sub-circuit 2012 according to the power control voltage (Vramp) and a second current output by the second current sub-circuit 2013 according to the power control voltage (Vramp).

It should be noted that the voltage conversion circuit 201 may include the first current sub-circuit 2012 and the second current sub-circuit 2013. Furthermore, an input end of the voltage conversion circuit 201 is connected to the power control voltage, to convert the power control voltage, so as to obtain the target control voltage.

The power control circuit 202 is connected to the voltage conversion circuit 201. An input end of the power control circuit 202 includes the target control voltage and the input signal, so that output power of the power amplifier may be controlled according to the target control voltage.

An embodiment of the disclosure provides a power control apparatus for improving harmonic waves, including a voltage conversion circuit and a power control circuit. The voltage conversion circuit is configured to convert a power control voltage, to output a target control voltage. The power control circuit is connected to the voltage conversion circuit, and is configured to perform power control on a received input signal according to the target control voltage, to obtain a target output signal. In this way, a DC voltage of a pre-stage power amplifier may be reduced when a bias current of a final-stage power amplifier is small, through cooperation of the voltage conversion circuit and the power control circuit, thereby reducing magnitudes of harmonic waves generated by the power amplifier during power back-off, which improves the harmonic performance of the power amplifier, and may improve call quality of a user in a more complex spectrum environment.

Figure 5:
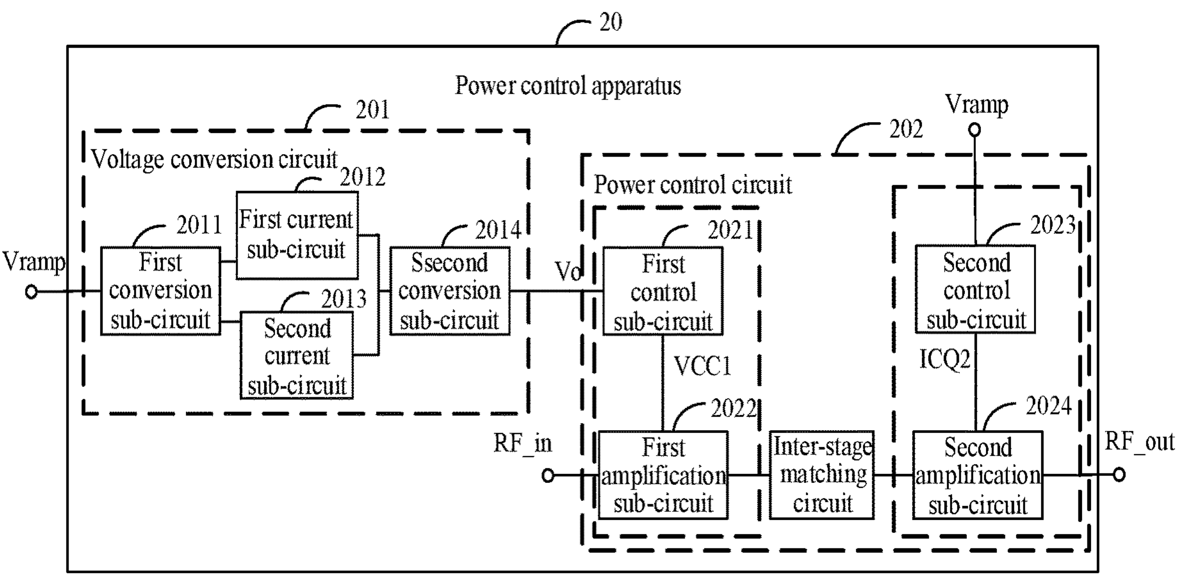
FIG. 5 is a schematic structural diagram of another power control apparatus provided by an embodiment of the disclosure.

In another embodiment of the disclosure, referring to FIG. 5, it shows a schematic structural diagram of another power control apparatus 20 provided by an embodiment of the disclosure. As shown in FIG. 5, in the power control apparatus 20, the voltage conversion circuit 201 may include a first conversion sub-circuit 2011, a first current sub-circuit 2012, a second current sub-circuit 2013 and a second conversion sub-circuit 2014.

The first conversion sub-circuit 2011 is configured to convert the power control voltage into a power control current.

The first current sub-circuit 2012 is connected to the first conversion sub-circuit 2011, and is configured to generate a first current according to the power control current.

The second current sub-circuit 2013 is connected to the first conversion sub-circuit 2011, and is configured to generate a second current according to the power control current.

The second conversion sub-circuit 2014 is connected to the first current sub-circuit 2012 and the second current sub-circuit 2013 respectively, and is configured to superimpose the first current and the second current and convert a superimposed current into the target control voltage.

It should be noted that the voltage conversion circuit 201 is constituted by the first conversion sub-circuit 2011, the first current sub-circuit 2012, the second current sub-circuit 2013 and the second conversion sub-circuit 2014, and specific connection relationships thereof are shown in FIG. 5.

The first conversion sub-circuit 2011 has an input end of the power control voltage (Vramp), and an output end of the power control current. That is, the essence of the first conversion sub-circuit 2011 is a voltage-to-current conversion circuit mainly configured to convert the target control voltage to obtain the power control current.

The first current sub-circuit 2012 and the second current sub-circuit 2013 are connected to the first conversion sub-circuit 2011 respectively, to obtain the power control current. After obtaining the power control current, the first current sub-circuit 2012 generates the first current according to the power control current, and the second current sub-circuit 2013 generates the second current according to the power control current.

Furthermore, the second conversion sub-circuit 2014 is connected to the first current sub-circuit 2012 and the second current sub-circuit 2013 respectively, and may superimpose the first current and the second current and convert the superimposed current into the target control voltage (Vo). That is, the second conversion sub-circuit 2014 includes an adder and a current-to-voltage conversion circuit in essence, the adder is configured to superimpose the first current and the second current, and the current-to-voltage conversion circuit is configured to convert the superimposed current into the target control voltage (Vo).

It should also be noted that circuit parameters of the first current sub-circuit 2012 and the second current sub-circuit 2013 may also be set to be adjustable. Specifically, adjustable circuit elements (an adjustable FET, an adjustable resistor, or the like) may be provided in the first current sub-circuit 2012 and the second current sub-circuit 2013, so that the circuit parameters of the power conversion circuit 201 may be adjusted through the adjustable circuit elements, therefore a conversion relationship between the power control voltage and the target control voltage is adjusted. Therefore, when a bias current of a final-stage power amplifier is small, magnitudes of harmonic waves generated by the power amplifier during power back-off may be reduced by reducing a DC voltage of a pre-stage power amplifier, which improves the harmonic performance of the power amplifier, and may improve call quality of a user in a more complex spectrum environment.

In this way, the power control voltage (Vramp) is converted into the target control voltage (Vo) through cooperation of the first conversion sub-circuit 2011, the second conversion sub-circuit 2014, the first current sub-circuit 2012 and the second current sub-circuit 2013, to facilitate subsequent operations.

Further, in some embodiments, as shown in FIG. 5, the power control circuit 202 may include a first control sub-circuit 2021, a first amplification sub-circuit 2022, a second control sub-circuit 2023 and a second amplification sub-circuit 2024.

The first control sub-circuit 2021 is configured to control a power supply voltage of the first amplification sub-circuit 2022 according to the target control voltage, to obtain a target power supply voltage.

The first amplification sub-circuit 2022 is connected to the first control sub-circuit 2021, and is configured to perform first-level power amplification on the received input signal according to the target power supply voltage, to obtain an initially amplified signal.

The second control sub-circuit 2023 is configured to control a bias current of the second amplification sub-circuit 2024 according to the power control voltage, to obtain a target bias current.

The second amplification sub-circuit 2024 is connected to the first amplification sub-circuit 2022 and the second control sub-circuit 2023 respectively, and is configured to perform second-level power amplification on the initially amplified signal according to the target bias current, to obtain the target output signal.

It should be noted that the power control circuit 202 includes the first control sub-circuit 2021, the first amplification sub-circuit 2022, the second control sub-circuit 2023 and the second amplification sub-circuit 2024. These four sub-circuits may be further divided into two parts, that is, a first power amplification circuit and a second power amplification circuit.

The first power amplification circuit is connected to the voltage conversion circuit 201, and may perform first-level power amplification on the received input signal under control of the target control voltage, to obtain the initially amplified signal; and the second power amplification circuit is connected to the first power amplification circuit, and may perform second-level power amplification on the initially amplified signal according to the power control voltage, to obtain the target output signal. For the second power amplification circuit, the power control voltage is used as an independent control signal to be connected to the second power amplification circuit.

Specifically, the first power circuit may include a first control sub-circuit 2021 and a first amplification sub-circuit 2022. Here the first control sub-circuit 2021 is configured to control the power supply voltage of the first amplification sub-circuit 2022 according to the target control voltage, to obtain the target power supply voltage (i.e., a DC voltage represented by VCC1); and the first amplification sub-circuit 2022 is configured to perform power amplification on the received input signal according to the target power supply voltage, to obtain the initially amplified signal. More specifically, the first control sub-circuit 2021 is connected to the voltage conversion circuit 201, that is, the target control voltage is input of the first control sub-circuit 2021, and the target power supply voltage is output of the first control sub-circuit 2021. That is, the first control sub-circuit 2021 supplies power to the first amplification sub-circuit 2022 by outputting the target power supply voltage (VCC1), so that output power of the first amplification sub-circuit 2022 may also be controlled by controlling the target power supply voltage (VCC1).

The second power circuit may include the second control sub-circuit 2023 and the second amplification sub-circuit 2024. Here the second control sub-circuit 2023 is configured to control a current of the second amplification sub-circuit 2024 according to the power control voltage, to obtain the target bias current; and the second amplification sub-circuit 2024 is configured to perform power amplification on the initially amplified signal according to the target bias current. More specifically, the second control sub-circuit 2023 is connected to an independently connected power control voltage (Vramp), and outputs the target bias current (ICQ2) according to the power control signal (Vramp). Furthermore, the second amplification sub-circuit 2024 is connected to the first amplification sub-circuit 2022, to receive the initially amplified signal, and the second amplification sub-circuit 2024 is also connected to the second control sub-circuit 2023, so that the second-level power amplification may be performed on the initially amplified signal under control of the target bias current (ICQ2), to obtain the target output signal. That is, the target bias current (ICQ2) outputted by the second control sub-circuit 2023 may control output power of the second amplification sub-circuit 2024.

In this way, the first amplification sub-circuit 2022 and the second amplification sub-circuit 2024 cooperate under control of the target power supply voltage (VCC1) and the target bias current (ICQ2), to complete amplification of the input signal, and improve harmonic waves output finally, thereby improving usage performance of the power amplifier.

In order to achieve impedance matching between different amplification sub-circuits, in some embodiments, the power control circuit 202 may further include an inter-stage matching circuit.

The inter-stage matching circuit is connected to the first amplification sub-circuit 2022 and the second amplification sub-circuit 2024 respectively, and is configured to perform impedance matching between the first amplification sub-circuit 2022 and the second amplification sub-circuit 2024.

It should be noted that in order to perform impedance matching between different amplification sub-circuits, an impedance matching circuit is usually arranged between different amplification sub-circuits. Therefore, the power amplifier further includes an inter-stage matching circuit connected to an output end of the first amplification sub-circuit 2022 and an input end of the second amplification sub-circuit 2024, to perform impedance matching between the first amplification sub-circuit 2022 and the second amplification sub-circuit 2024.

It should also be noted that the embodiments of the disclosure are only described with reference to the two-stage power amplifier, which does not mean that the power control apparatus of the disclosure is limited to the two-stage power amplifier only. The core of the disclosure is the power control apparatus, and those skilled in the art may appropriately expand and deform it according to contents of the disclosure, to apply the power control apparatus to power amplifiers with different structures, which also falls within the scope of protection of the disclosure.

In other words, the current power control methods in some implementations only directly control output power of the power amplifier according to the power control voltage, resulting in generation of large harmonic waves. However, in the embodiments of the disclosure, due to existence of the voltage conversion circuit, conversion is made on the power control voltage, to obtain the target control voltage, then the output power of the power amplifier is controlled according to a combined action of the target control voltage and the power control voltage, thereby reducing magnitudes of harmonic waves generated by the power amplifier during power back-off, to improve the harmonic performance of the power amplifier.

An embodiment of the disclosure provides a power control apparatus. Through detailed descriptions of the aforementioned embodiments in this embodiment, it may be seen that a DC voltage of a pre-stage power amplifier may be reduced when a bias current of a final-stage power amplifier is small, through cooperation of the voltage conversion circuit and the power control circuit, thereby reducing magnitudes of harmonic waves generated by the power amplifier during power back-off, which improves the harmonic performance of the power amplifier, and may improve call quality of a user in a more complex spectrum environment.

Figure 6:
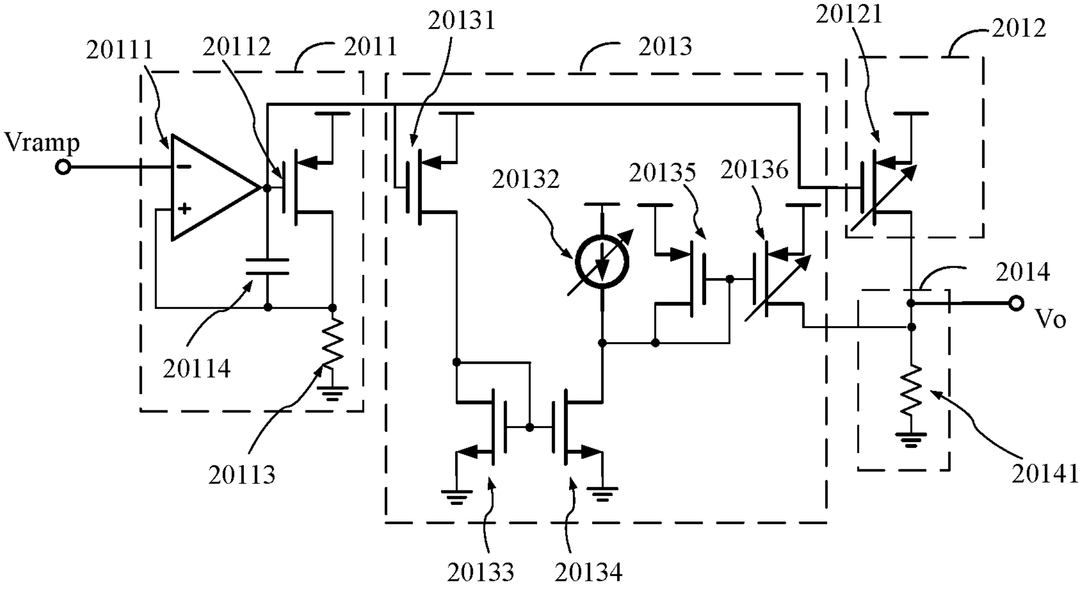
FIG. 6 is a schematic structural diagram of yet another power control apparatus provided by an embodiment of the disclosure.

In another embodiment of the disclosure, referring to FIG. 6, it shows a schematic structural diagram of yet another power control apparatus provided by an embodiment of the disclosure. As shown in FIG. 6, the first conversion sub-circuit 2011 may include an operational amplifier 20111, a first FET 20112, a first resistor 20113 and a capacitor 20114.

An inverting input end of the operational amplifier 20111 is connected to the power control voltage, an output end of the operational amplifier 20111 is connected to a gate of the first FET 20112 and one end of the capacitor 20114 respectively, the other end of the capacitor 20114 is connected to a non-inverting input end of the operational amplifier 20111, a drain of the first FET 20112 and the first resistor 20113 respectively, and the drain of the first FET 20112 is grounded through the first resistor 20113.

It should be noted that the first conversion sub-circuit 2011 includes the operational amplifier 20111, the first FET 20112, the first resistor 20113 and the capacitor 20114, and specific connection relationships thereof are shown in FIG. 6. The inverting input end of the operational amplifier 20111 is connected to the power control voltage (Vramp), and the output end of the operational amplifier 20111 is connected to the gate of the first FET 20112. At this time, a current flowing through the first FET 20112 is determined by Vramp and the resistor 20113, that is, a current value of the first FET 20112 is approximately equal to Vramp/R, here R is a resistance value of the resistor 20113.

Further, in some embodiments, the second current sub-circuit 2013 may include a second FET 20131, a first FET group, a second FET group and an adjustable current source 20132.

A gate of the second FET 20131 is connected to the output end of the operational amplifier, a drain of the second FET 20131 is connected to an input end of the first FET group, and an output end of the first FET group is connected to an input end of the second FET group and the adjustable current source 20132 respectively.

It should be noted that the second current sub-circuit 2013 includes the second FET 20131, the first FET group, the second FET group and the adjustable current source 20132. The gate of the second FET 20131 is connected to the output end of the operational amplifier 20111. More specifically, a width-to-length ratio of the second FET 20131 is N times that of the first FET 20112, so that a current flowing through the second FET 20131 is N times the current flowing through the first FET 20112, here a value of N is a positive number.

Further, in some embodiments, the first FET group may include a fourth FET 20133 and a fifth FET 20134 connected by a common gate structure.

The second FET group includes a sixth FET 20135 and a seventh adjustable FET 20136 connected by a common gate structure.

It should be noted that the first FET group includes the fourth FET 20133 and the fifth FET 20134 connected by the common gate structure. That is, the fourth FET 20133 and the fifth FET 20134 form a current mirror.

Similarly, the second FET group includes the sixth FET 20135 and the seventh adjustable FET 20136 connected by the common gate structure. That is, the sixth FET 20135 and the seventh adjustable FET 20136 form a current mirror.

Furthermore, for the second current sub-circuit 2013, basic parameters of the adjustable current source 20132 and the seventh adjustable FET 20136 may be adjusted, so that the second current output by the second current sub-circuit 2013 may be adjusted.

Further, in some embodiments, the first current sub-circuit 2012 may include a third adjustable FET 20121, and the second conversion sub-circuit 2014 may include a second resistor 20141.

A gate of the third adjustable FET 20121 is connected to the output end of the operational amplifier 20111, and a drain of the third adjustable FET 20121 is connected to an output end of the second FET group and is grounded through the second resistor 20141.

It should be noted that the first current sub-circuit 2012 includes the third adjustable FET 20121, of which the gate is connected to the output end of the operational amplifier 20111. More specifically, a width-to-length ratio of the third adjustable FET 20121 is M times that of the first FET 20112, so that a current flowing through the third adjustable FET 20121 is M times the current flowing through the first FET 20112, here a value of M is a positive number.

In this way, after obtaining the first current and the second current, a final target control voltage (Vo) may be obtained through the second conversion sub-circuit 2014, and a specific connection relationship is shown in FIG. 6.

Furthermore, basic parameters of the third adjustable FET 20121 may be adjusted, so that the first current output by the first current sub-circuit 2012 may be adjusted.

It should be noted that the second conversion sub-circuit 2014 includes the second resistor 20141 connected to output ends of the third adjustable FET 20121 and the seventh adjustable FET 20136 respectively, and the target control voltage Vo output finally is taken from a circuit between the second resistor 20141 and the third adjustable FET 20121/the seventh adjustable FET 20136, as shown in FIG. 6 specifically, here intensity of Vo is shown as an expression as follows:

$$Vo=(IDS7+IDS3)*R2 \quad (2)$$

Here IDS7 represents a drain-source current flowing through the seventh adjustable FET 20136, and IDS3 represents a drain-source current flowing through the third adjustable FET 20121.

It should also be noted that FETs in the embodiments of the disclosure may include N-Metal-Oxide-Semiconductor (NMOS), P-Metal-Oxide-Semiconductor (PMOS) or Heterojunction bipolar transistor (HBT) and other existing types of FETs, or similar electrical elements that may play the same role.

Figure 7:
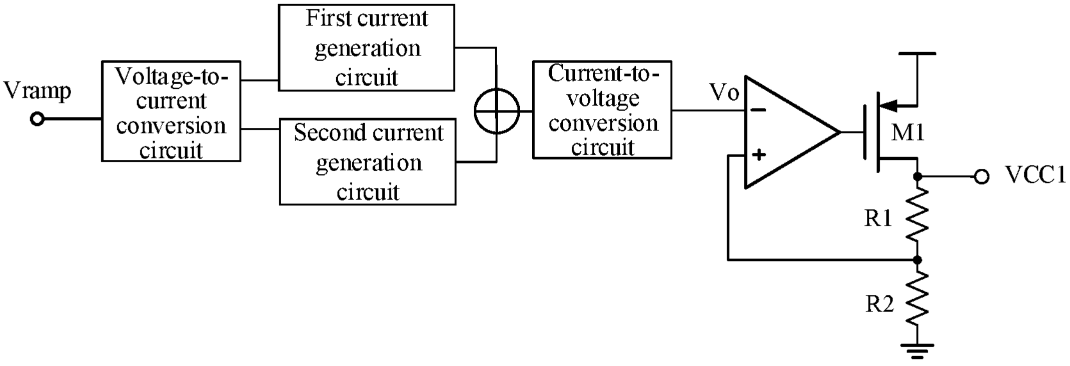
FIG. 7 is a schematic diagram of an application scenario of a power control apparatus provided by an embodiment of the disclosure.
Figure 8:
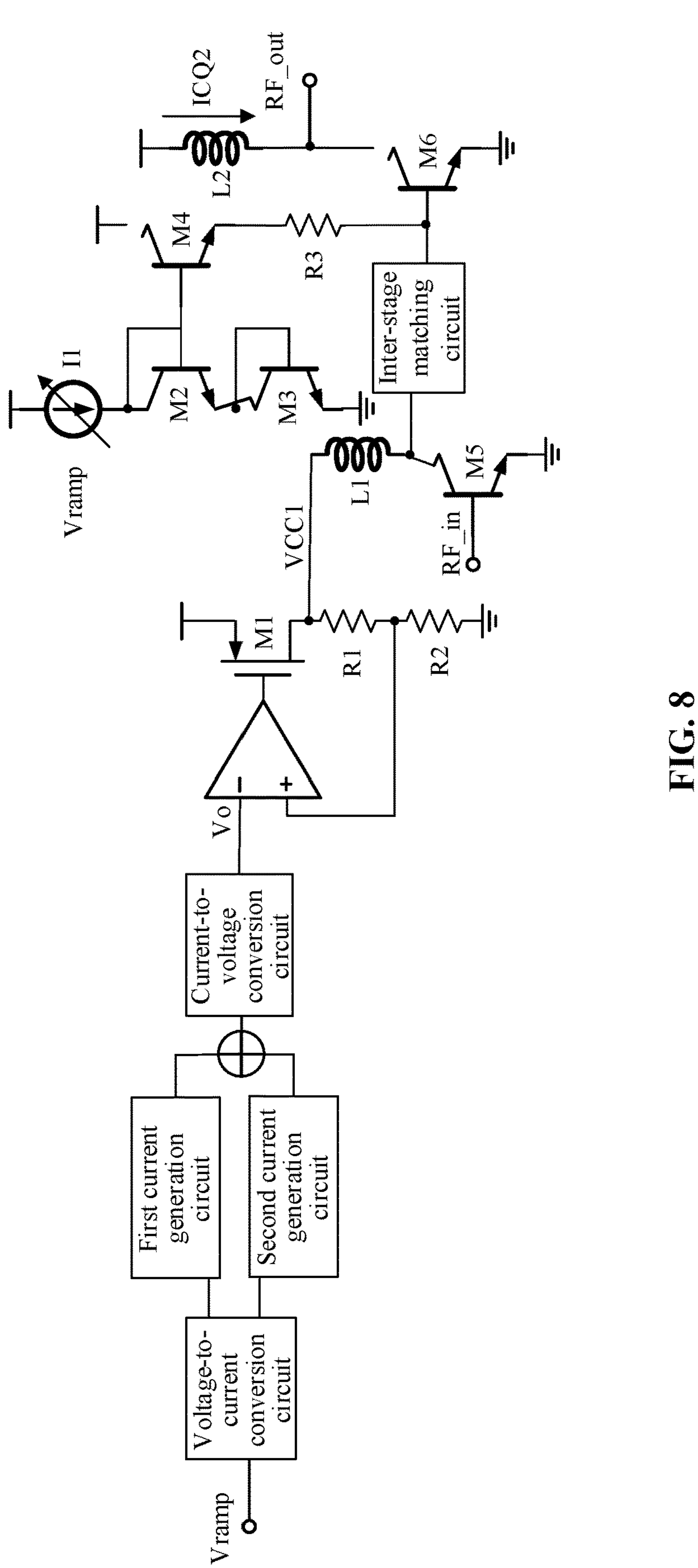
FIG. 8 is a schematic diagram of an application scenario of another power control apparatus provided by an embodiment of the disclosure.

To sum up, in order to solve the problem that the GSM power amplifier has worse harmonic waves after power back-off, please refer to FIG. 7 and FIG. 8, FIG. 7 shows a schematic diagram of an application scenario of a power control apparatus provided by an embodiment of the disclosure, and FIG. 8 shows a schematic diagram of an application scenario of another power control apparatus provided by an embodiment of the disclosure. As shown in FIG. 7 and FIG. 8, embodiments of the disclosure are equivalent to making improvements on the basis of FIG. 1, that is, adding a voltage conversion circuit (i.e., the whole piece constituted by a voltage-to-current conversion circuit, a first current generation circuit, a second current generation circuit and a current-voltage conversion circuit), while the rest is consistent with FIG. 1.

As shown in FIG. 7 and FIG. 8, the voltage-to-current conversion circuit (equivalent to the aforementioned first conversion sub-circuit) converts Vramp into a current signal, the current signal is processed by the first current generation circuit (equivalent to the aforementioned first current sub-circuit) and the second current generation circuit (equivalent to the aforementioned second current sub-circuit) and added and output to the current-to-voltage conversion circuit (equivalent to the aforementioned second conversion sub-circuit). The current-to-voltage conversion circuit outputs a voltage Vo controlled by Vramp to an inverting input end of the operational amplifier. The operational amplifier, M1, R1 and R2 constitute a Low Dropout Regulator (LDO) and output VCC1 for supplying power to the pre-stage power amplifier. Output ends of the first current generation circuit and the second current generation circuit may also be connected to an adder, to add currents generated by the first current generation circuit and the second current generation circuit. That is, the voltage-to-current conversion circuit, the first current generation circuit, the second current generation circuit, the adder, and the current-to-voltage conversion circuit constitute the aforementioned "voltage conversion circuit".

To sum up, referring to the aforementioned FIG. 6, in the power control apparatus, the operational amplifier 20111, the first FET 20112/the second FET 20131/the third adjustable FET 20121, the first resistor 20113 and the capacitor 20114 constitute a voltage-to-current conversion circuit which outputs through the second FET 20131 and the third adjustable FET 20121. The third adjustable FET 20121 implements the first current generation circuit; and the second FET 20131, the fourth FET 20133, the fifth FET 20134, the sixth FET 20135, the seventh adjustable FET 20136 and the adjustable current source 20132 implement the second current generation circuit, here both the adjustable current source 20132 and the seventh adjustable FET 20136 are adjustable. The second resistor 20141 implements current-to-voltage conversion and outputs Vo to the inverting input end of the operational amplifier shown in FIG. 7.

Figure 9A:
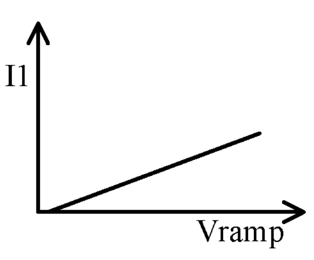
FIG. 9A is a schematic diagram of change between I1 and Vramp provided by an embodiment of the disclosure.
Figure 9B:
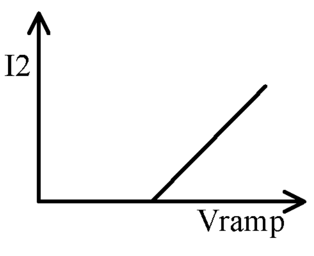
FIG. 9B is a schematic diagram of change between I2 and Vramp provided by an embodiment of the disclosure.
Figure 9C:
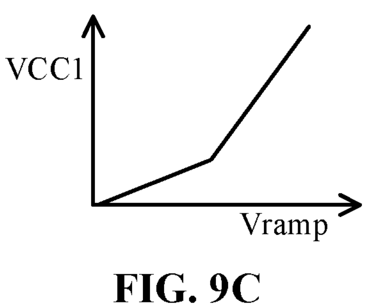
FIG. 9C is a schematic diagram of change between VCC1 and Vramp provided by an embodiment of the disclosure.

Based on the power control apparatus shown in FIG. 6, FIG. 9A shows a schematic diagram of change between I1 and Vramp provided by an embodiment of the disclosure, here X axis (i.e., a horizontal axis) represents Vramp, and Y axis (i.e., a vertical axis) represents I1 which is a current generated by the first current generation circuit. FIG. 9B shows a schematic diagram of change between I2 and Vramp provided by an embodiment of the disclosure, here X axis (i.e., a horizontal axis) represents Vramp, and Y axis (i.e., a vertical axis) represents I2 which is a current generated by the second current generation circuit. FIG. 9C shows a schematic diagram of change between VCC1 and Vramp provided by an embodiment of the disclosure, here X axis (i.e., a horizontal axis) represents Vramp, and Y axis (i.e., a vertical axis) represents VCC1. As shown in FIG. 9A and FIG. 10B, both I1 and I2 increase with the increase of Vramp, but have different increasing trends; and as shown in FIG. 9C, VCC1 also increases with the increase of Vramp, and has an increasing trend depending on I1 and I2. That is, a relationship between VCC1 and Vramp may be controlled by controlling changing trends of I1 and I2 with Vramp.

Figure 10:
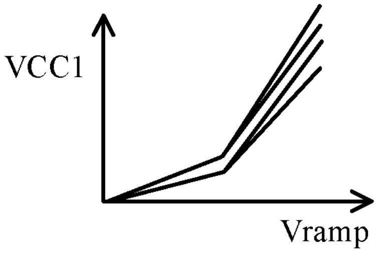
FIG. 10 is a schematic diagram of change between Vo and Vramp provided by an embodiment of the disclosure.
Figure 11:
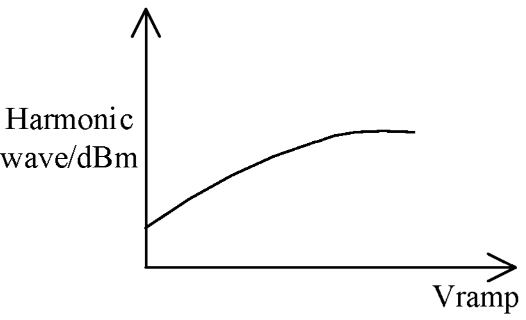
FIG. 11 is a schematic diagram of change between a harmonic wave and Vramp provided by an embodiment of the disclosure.

Since there are adjustable circuit elements in the first current generation circuit and the second current generation circuit, appropriate circuit parameters may be configured through a digital control circuit, to adjust a curve of Vo changing with Vramp. Referring to FIG. 10, it shows a schematic diagram of change between Vo and Vramp provided by an embodiment of the disclosure, here X axis (i.e., a horizontal axis) represents Vramp, and Y axis (i.e., a vertical axis) represents Vo. As shown in FIG. 10, curves of Vo changing with Vramp are different based on different circuit parameters. An appropriate curve of VCC1 changing with Vramp may be set by selecting an appropriate curve of Vo changing with Vramp, which may reduce VCC when ICQ2 is small, reduce the input power of the final-stage, and finally reduce intensity of the harmonic wave. Referring to FIG. 11, it shows a schematic diagram of change between a harmonic wave and Vramp provided by an embodiment of the disclosure, here X axis (i.e., a horizontal axis) represents Vramp, and Y axis (i.e., a vertical axis) represents a magnitude of a harmonic wave. As shown in FIG. 11, when Vramp is large, the intensity of the harmonic wave in the embodiments of the disclosure is significantly lower than that in some implementations. Furthermore, the intensity of the harmonic wave does not increase significantly during power back-off. That is, the power control apparatus 20 of the disclosure reduces the input power of the final-stage by reducing VCC1 when ICQ2 is small, thereby reducing harmonic waves output by the final-stage, and improving the harmonic performance after power back-off.

An embodiment of the disclosure provides a power control apparatus. Through detailed descriptions of the aforementioned embodiments in this embodiment, it may be seen that a DC voltage of a pre-stage power amplifier may be reduced when a bias current of a final-stage power amplifier is small, through cooperation of the voltage conversion circuit and the power control circuit, thereby reducing magnitudes of harmonic waves generated by the power amplifier during power back-off, which improves the harmonic performance of the power amplifier, and may improve call quality of a user in a more complex spectrum environment.

Figure 12:
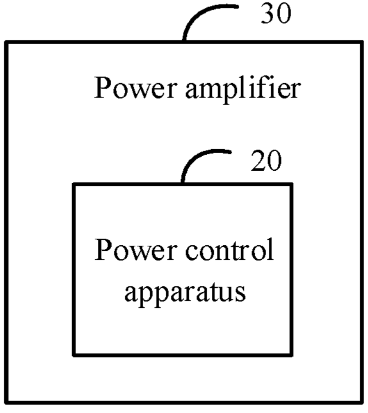
FIG. 12 is a schematic structural diagram of a power amplifier provided by an embodiment of the disclosure.

In yet another embodiment of the disclosure, referring to FIG. 12, it shows a schematic structural diagram of a power amplifier 30 provided by an embodiment of the disclosure. As shown in FIG. 12, the power amplifier 30 includes at least the power control apparatus 20 described in the aforementioned embodiments.

In this way, for the power amplifier 30, the power control apparatus therein includes a voltage conversion circuit and a power control circuit, therefore according to detailed descriptions of the aforementioned embodiments, a DC voltage of a pre-stage power amplifier may be reduced when a bias current of a final-stage power amplifier is small, through cooperation of the voltage conversion circuit and the power control circuit, thereby reducing magnitudes of harmonic waves generated by the power amplifier during power back-off, which improves the harmonic performance of the power amplifier, and may improve call quality of a user in a more complex spectrum environment.

Figure 13:
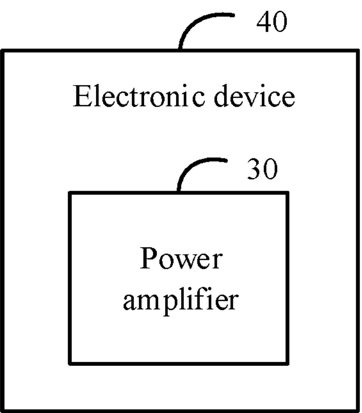
FIG. 13 is a schematic structural diagram of an electronic device provided by an embodiment of the disclosure.

In yet another embodiment of the disclosure, referring to FIG. 13, it shows a schematic structural diagram of an electronic device 40 provided by an embodiment of the disclosure. As shown in FIG. 13, the electronic device 40 includes at least the power amplifier 30 described in the aforementioned embodiments.

In this way, for the electronic device 40, the power control apparatus therein includes a voltage conversion circuit and a power control circuit, therefore according to detailed descriptions of the aforementioned embodiments, a DC voltage of a pre-stage power amplifier may be reduced when a bias current of a final-stage power amplifier is small, through cooperation of the voltage conversion circuit and the power control circuit, thereby reducing magnitudes of harmonic waves generated by the power amplifier during power back-off, which improves the harmonic performance of the power amplifier, and may improve call quality of a user in a more complex spectrum environment.

It should be noted that in the disclosure, terms "including", "include" or any other variant thereof are intended to encompass non-exclusive inclusion, to allow a process, method, article or apparatus including a series of elements to include not only those elements, but also other elements which are not listed clearly or elements inherent to such process, method, article or apparatus. Without further limitation, an element defined by a phrase "including a . . . " does not preclude presence of additional identical elements in a process, method, article or apparatus including the element.

Serial numbers of the aforementioned embodiments of the disclosure are only intended for description, and do not represent advantages or disadvantages of the embodiments.

The methods disclosed in several method embodiments provided in the disclosure may be combined arbitrarily without conflict, to obtain new method embodiments.

The features disclosed in several product embodiments provided in the disclosure may be combined arbitrarily without conflict, to obtain new product embodiments.

The features disclosed in several method or device embodiments provided in the disclosure may be combined arbitrarily without conflict, to obtain new method embodiments or device embodiments.

The above descriptions are only specific implementations of the disclosure, however, the scope of protection of the disclosure is not limited thereto. Variation or replacement readily conceivable by any person skilled in the art within the technical scope of the disclosure shall fall within the scope of protection of the disclosure. Therefore, the scope of protection of the disclosure should be subjected to the scope of protection of the claims.

In the embodiments of the disclosure, the power control apparatus includes a voltage conversion circuit and a power control circuit. The voltage conversion circuit is configured to convert a power control voltage, to output a target control voltage. The power control circuit is connected to the voltage conversion circuit, and is configured to perform power control on a received input signal according to the target control voltage, to obtain a target output signal. In this way, a DC voltage of a pre-stage power amplifier may be reduced when a bias current of a final-stage power amplifier is small, through cooperation of the voltage conversion circuit and the power control circuit, thereby reducing magnitudes of harmonic waves generated by the power amplifier during power back-off, which may not only improve the harmonic performance of the power amplifier, but also improve call quality of a user in a more complex spectrum environment.

What is claimed is:

1. A power control apparatus for improving harmonic waves, comprising:

a voltage conversion circuit configured to convert a power control voltage, to output a target control voltage; and a power control circuit connected to the voltage conversion circuit, and configured to perform power control on a received input signal according to the target control voltage, to obtain a target output signal;

wherein the voltage conversion circuit comprises:

a first conversion sub-circuit configured to convert the power control voltage into a power control current;

a first current sub-circuit connected to the first conversion sub-circuit, and configured to generate a first current according to the power control current;

a second current sub-circuit connected to the first conversion sub-circuit, and configured to generate a second current according to the power control current; and a second conversion sub-circuit connected to the first current sub-circuit and the second current sub-circuit respectively, and configured to superimpose the first current and the second current and convert a superimposed current into the target control voltage;

wherein the first conversion sub-circuit comprises an operational amplifier, a first field effect transistor (FET), a first resistor and a capacitor, an inverting input end of the operational amplifier is connected to the power control voltage, an output end of the operational amplifier is connected to a gate of the first FET and one end of the capacitor respectively, the other end of the capacitor is connected to a non-inverting input end of the operational amplifier, a drain of the first FET and the first resistor respectively, and the drain of the first FET is grounded through the first resistor;

wherein the second current sub-circuit comprises a second FET, a first FET group, a second FET group and an adjustable current source, to thereby facilitate power controlling and, through cooperation of the voltage conversion circuit and the power control circuit, reducing magnitudes of the harmonic waves generated by a power amplifier.

2. The power control apparatus of claim 1, wherein the power control circuit comprises:

a first control sub-circuit configured to control a power supply voltage of a first amplification sub-circuit according to the target control voltage, to obtain a target power supply voltage;

the first amplification sub-circuit connected to the first control sub-circuit, and configured to perform first-level power amplification on the received input signal according to the target power supply voltage, to obtain an initially amplified signal;

a second control sub-circuit configured to control a bias current of a second amplification sub-circuit according to the power control voltage, to obtain a target bias current; and the second amplification sub-circuit connected to the first amplification sub-circuit and the second control sub-circuit respectively, and configured to perform second-level power amplification on the initially amplified signal according to the target bias current, to obtain the target output signal.

3. The power control apparatus of claim 2, wherein the power control circuit further comprises:

an inter-stage matching circuit connected to the first amplification sub-circuit and the second amplification sub-circuit respectively, and configured to perform impedance matching between the first amplification sub-circuit and the second amplification sub-circuit.

4. The power control apparatus of claim 1, wherein a gate of the second FET is connected to the output end of the operational amplifier, a drain of the second FET is connected to an input end of the first FET group, and an output end of the first FET group is connected to an input end of the second FET group and the adjustable current source respectively.

5. The power control apparatus of claim 4, wherein the first current sub-circuit comprises a third adjustable FET, and the second conversion sub-circuit comprises a second resistor, a gate of the third adjustable FET is connected to the output end of the operational amplifier, and a drain of the third adjustable FET is connected to an output end of the second FET group and is grounded through the second resistor.

6. The power control apparatus of claim 4, wherein the first FET group comprises a fourth FET and a fifth FET connected by a common gate structure, and the second FET group comprises a sixth FET and a seventh adjustable FET connected by a common gate structure.

7. A power amplifier comprising at least the power control apparatus of claim 1.

8. An electronic device comprising at least the power amplifier of claim 7.

9. The power control apparatus of claim 6, wherein the target control voltage Vo=(IDS7+IDS3)*R2, wherein IDS7 represents a drain-source current flowing through the seventh adjustable FET, IDS3 represents a drain-source current flowing through the third adjustable FET, and R2 represents the second resistor.

* * * * *